United States Patent
Webb et al.

[11] Patent Number: 5,920,120
[45] Date of Patent: Jul. 6, 1999

[54] ASSEMBLY FOR DISSIPATATING HEAT FROM A SEMICONDUCTOR CHIP WHEREIN A STRESS ON THE SEMICONDUCTOR CHIP DUE TO A THERMALLY CONDUCTIVE MEMBER IS PARTIALLY RELIEVED

[75] Inventors: James S. Webb, Portland, Oreg.; Jack L. Goodman, Gilbert, Ariz.; Nadir Sharaf, Olympia, Wash.; Lawrence E. McKay, Kent, Wash.

[73] Assignee: Intel Corporation, Santa Clara, Calif.

[21] Appl. No.: 08/995,235

[22] Filed: Dec. 19, 1997

[51] Int. Cl.⁶ .............................. H01L 23/34; H01L 23/10
[52] U.S. Cl. ..................... 257/719; 257/718; 257/726; 257/727; 257/737; 257/778; 257/738; 361/809
[58] Field of Search ..................... 257/704, 706, 257/709, 710, 717, 719, 718, 726, 727, 737, 734, 738, 778; 361/809

[56] References Cited

U.S. PATENT DOCUMENTS

| | | | |
|---|---|---|---|
| 5,065,280 | 11/1991 | Karnezos et al. | 257/727 |
| 5,345,102 | 9/1994 | Daikoku et al. | 257/718 |
| 5,500,556 | 3/1996 | Kosugi | 257/718 |
| 5,592,021 | 1/1997 | Meschter et al. | 257/727 |
| 5,719,443 | 2/1998 | Messina | 257/718 |
| 5,754,400 | 5/1998 | Sathe et al. | 257/718 |

FOREIGN PATENT DOCUMENTS 4-10458  1/1992  Japan ..................... 257/727

*Primary Examiner*—Alexander Oscar Williams
*Attorney, Agent, or Firm*—Blakely, Sokoloff, Taylor & Zafman

[57] ABSTRACT

An assembly comprising a substrate, a thermally conductive member which is spaced from the substrate, and a semiconductor chip located on a side of the substrate facing the thermally conductive member. A resilient component is compressed between the substrate and the thermally conductive member so that a force clamping the substrate and the thermally conductive member together is shared by at least the semiconductor chip and the component.

15 Claims, 2 Drawing Sheets

ASSEMBLY FOR DISSIPATATING HEAT FROM A SEMICONDUCTOR CHIP WHEREIN A STRESS ON THE SEMICONDUCTOR CHIP DUE TO A THERMALLY CONDUCTIVE MEMBER IS PARTIALLY RELIEVED

BACKGROUND OF THE INVENTION

1. Field of the Invention

The present invention relates to a stress relieved assembly for dissipating heat from a semiconductor chip, comprising a substrate, a semiconductor chip, and a thermally conductive member which is brought into contact with the chip.

2. Discussion of Related Art

Semiconductor chips heat up when powered up and operated. For this reason, the semiconductor chips are usually mounted against a thermally conductive plate which transfers heat away therefrom, usually to a heat sink of some sort.

FIG. 1 of the accompanying drawings illustrates an assembly 1 of the prior art comprising a substrate 2, a semiconductor chip 3 located on the substrate 2, and a thermally conductive plate 4 thermally coupled to the semiconductor chip 3. The semiconductor chip 3 may be connected to the substrate 2 by means of an array of solder connections 5. A layer of thermally conductive material 6 may be located between the semiconductor chip 3 and the thermally conductive plate 4. The assembly 1 is held together by means of a clamping structure (not shown) which exerts a clamping force F on the assembly 1. A certain amount of shock and vibration occurs during transportation of the assembly 1, tending to move the thermally conductive plate 4 away from the substrate 2. The clamping force F is sufficient to a hold the assembly 1 intact during normal shock and vibration. The clamping force F may, however, be of a magnitude which may cause damage to the semiconductor chip 3 or the solder connections 5. The layer 6 has some damping effect against shock and vibration. The layer 6, however, has better damping under reduced clamping forces.

It would therefore be desirable to reduce the force acting on the semiconductor chip 3, the solder connections 5, and the layer 6 while still holding the assembly 1 together.

SUMMARY OF THE INVENTION

One embodiment of the present invention is an assembly which may include a substrate, a thermally conductive member which is spaced from the substrate, and a semiconductor chip located on a side of the substrate facing the thermally conductive member. At least one component is located between the substrate and the thermally conductive member. A force clamping the substrate and the thermally conductive member together is at least partially carried by the component.

DETAILED DESCRIPTION OF THE INVENTION

Figure 1:
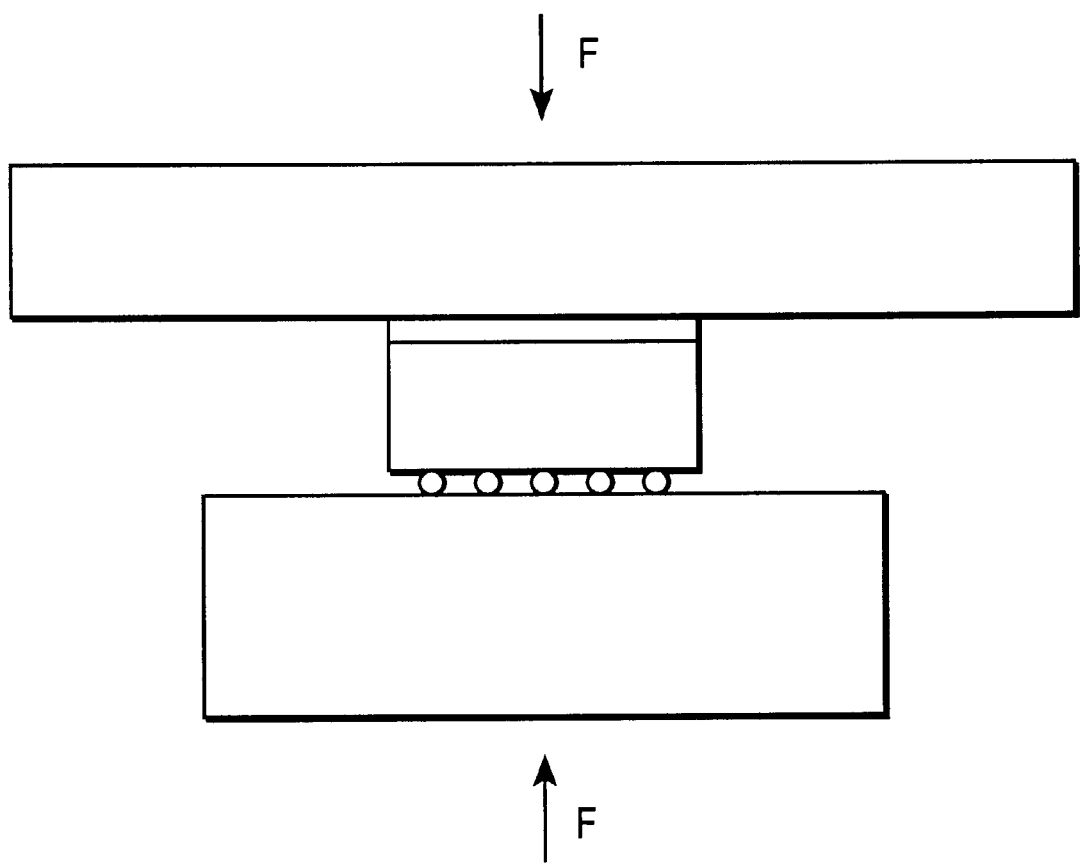
FIG. 1 is a side view of a substrate, a semiconductor chip, and a thermally conductive plate according to the prior art.
Figure 2:
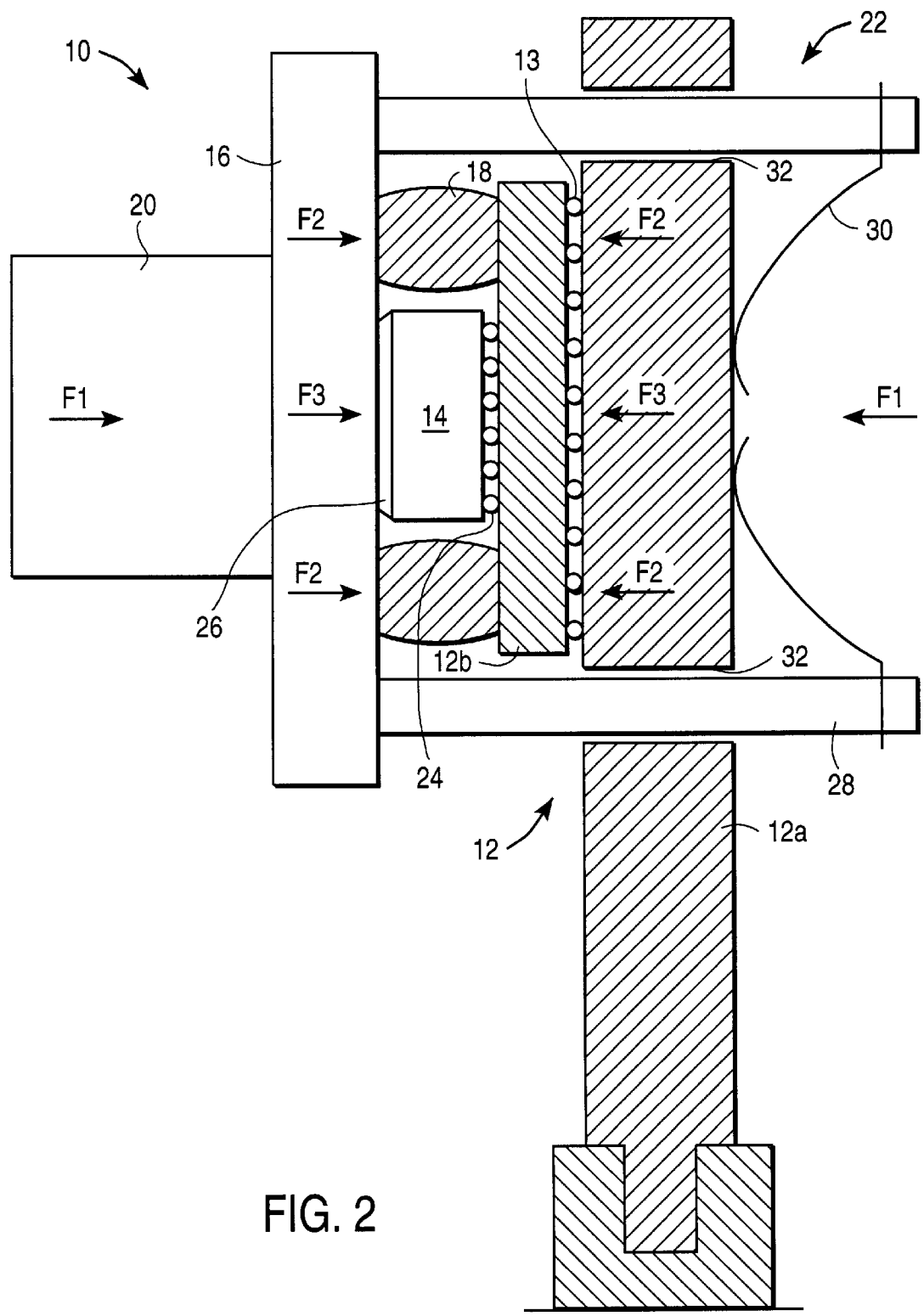
FIG. 2 is a partially sectioned side view of an embodiment of an assembly according to the present invention.

FIG. 2 of the accompanying drawings illustrates an embodiment of the assembly 10, according to the invention, which may include a substrate 12, a semiconductor chip 14, a thermally conductive plate 16, a component 18, a heat sink 20, and a clamping structure 22.

The substrate 12 comprises a main substrate 12a and an interposer substrate 12b which may be located on the main substrate via an array of solder balls 13.

The semiconductor chip 14 may be connected to the interposer substrate 12b via an array of solder connections 24 located between the interposer substrate 12b and the semiconductor chip 14. A thin layer of thermally conductive material 26 may be located on a surface of the semiconductor chip 14. The layer 26 may be of any material which has a relatively high thermal conductivity, such as silicone grease.

The component 18 may be constructed from an elastomeric material which has a donut shape that surrounds the semiconductor chip 14.

The thermally conductive plate 16 is spaced from the interposer substrate 12b with the semiconductor chip 14 and the resilient component 18 located between the interposer substrate 12b and the thermally conductive plate 16.

The heat sink 20 may be secured to the thermally conductive plate 16 by means of screws, bolts, rivets or any other means which would allow the heat sink to conduct heat from the thermally conductive plate 16.

The clamping structure 22 may include a number of pins 28 and a number of leaf springs 30. The pins 28 extend from the thermally conductive plate 16 through openings 32 within the main substrate 12a. The leaf springs 30 are located on the pins 28 on a side of the substrate 12 opposing the thermally conductive plate 16. The leaf springs 30 are positioned to act on a surface of the main substrate 12a. The pins 28 and the leaf springs 30 clamp the substrate 12 and the thermally conductive plate 16 together with a clamping force F1. The clamping force F1 is dependent, inter alia, on the spring constant of the leaf springs 30.

The resilient component 18 is initially wider than shown in FIG. 2. When the clamping force F1 comes into play, the component 18 may be compressed between the substrate 14 and the thermally conductive plate 16. The component 18 may be deflected until the thermally conductive plate 16 pushes against the layer 26 on the semiconductor chip 14. The clamping force F1 may include a spring force F2 component on the resilient component 18. A further increase in the clamping force is then balanced by a resultant force F3 acting on the semiconductor chip 14. The clamping force F1 may thus be shared by the semiconductor chip 14 and the resilient component 18.

One edge of the substrate 14 may have a plurality of conductive pads (not shown) that are inserted into a card edge connector 36. The card edge connector 36 may be mounted to a motherboard 32 of a computer system.

Shock and vibration during transportation of the assembly 10 tends to move the thermally conductive plate 16 away from the substrate 12. The clamping structure 22 is designed so that the clamping force F1 may be sufficient to keep the assembly 10 intact during normal shock and vibration. The clamping force F1 may be in the range of between 50 N and 85 N. The clamping force F1 may be of a magnitude that would result in damage to the semiconductor chip 14 or the solder connections 24 if this force was exerted on the chip 14 alone. Spreading the clamping force F1 between the semiconductor chip 14 and the resilient component 18 reduces the resultant force F3 that is exerted on the chip 14. In addition, a certain amount of shock and vibration may be absorbed by the layer 26. Shock and vibration is most effectively absorbed by such a layer under reduced clamping forces. By spreading the clamping force F1 between the semiconductor chip 14 and the resilient component 18, the resultant force F3 on the layer 26 may be reduced to allow for more effective damping of shock and vibration by the layer. At the same time the clamping force F1 is maintained at a magnitude sufficient to keep the assembly 10 intact.

The spring force F2 is typically at least 50% of the clamping force F1 and may for example be in the range of about 45 N. That would leave a resultant force F3 acting on the semiconductor chip 14 of between 5 N and 55 N. The resilient component 18 has a relatively low spring constant, typically below 10 N/mm. A low spring constant may compensate for tolerances in the height of the semiconductor chip 14, from assembly to assembly, without much change in the spring force F2. The height of the semiconductor chip 14 typically varies by about 0.2 mm from assembly to assembly. The spring constant of about 10 N/mm will therefore result in differences in the spring force F2, from assembly to assembly, of less than 5%.

As can be seen from the aforegoing description, the assembly 10 is held together by a clamping force F1 which may be sufficient to overcome normal shock and vibration and hold the assembly 10 together in normal operating conditions. At the same time the semiconductor chip 14 is brought into contact with the thermally conductive plate 16 so as to transfer heat from the semiconductor chip 14 through the thermally conductive plate 16 to the heat sink 20.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. An assembly comprising:
   a substrate;
   a thermally conductive member which is spaced from the substrate;
   a semiconductor chip located on a side of the substrate facing the thermally conductive member, the semiconductor chip being thermally coupled to the thermally conductive member;
   at least one resilient component located between the substrate and the thermally conductive member; and
   a clamping structure clamping the substrate and the thermally conductive member together under a clamping force so as to compress the resilient component between the substrate and the thermally conductive member against a spring force of the resilient component until the clamping force is shared between the semiconductor chip and the resilient component.

2. The assembly as recited in claim 1 wherein the semiconductor chip carries less than 50% of the clamping force.

3. The assembly as recited in claim 1 wherein the component has a spring constant which is less than 10 N/mm.

4. The assembly as recited in claim 1 wherein the substrate comprises a main substrate and an interposer substrate located on the main substrate.

5. The assembly as recited in claim 1, further comprising a heat sink contacting the thermally conductive member to transfer heat therefrom.

6. The assembly as recited in claim 1, further comprising an array of solder connectors located between the substrate and the semiconductor chip.

7. The assembly as recited in claim 1, further comprising a layer of thermally conductive material located between the semiconductor chip and the thermally conductive member.

8. An assembly comprising:
   a substrate;
   a semiconductor chip located on the substrate;
   a thermally conductive member;
   a resilient component which is located between the substrate and the thermally conductive member; and
   a clamping structure clamping the substrate and the thermally conductive member together so that the resilient component is deflected under a force exerted by the clamping structure against a spring force of the resilient component until the semiconductor chip is thermally coupled with the thermally conductive member and the force is shared between the semiconductor chip and the component with the resilient component carrying at least 50% of the force.

9. A method of assembling a semiconductor chip located on a substrate and a thermally conductive member, comprising the steps of:
   locating a member between the substrate and the thermally conductive member; and
   clamping the substrate and the thermally conductive member to one another under a force so as to deflect the resilient member against a spring force of the resilient component until the semiconductor chip is thermally coupled with the thermally conductive member.

10. The assembly of claim 8 wherein the component has a spring constant which is less than 10 N/mm.

11. The assembly of claim 8 wherein the substrate comprises a main substrate and an interposer substrate located on the main substrate.

12. The assembly of claim 8, further comprising a heat sink contacting the thermally conductive member to transfer heat therefrom.

13. The assembly of claim 8, further comprising an array of solder connectors located between the substrate and the semiconductor chip.

14. The assembly of claim 8, further comprising a layer of thermally conductive material located between the semiconductor chip and the thermally conductive member.

15. The assembly of claim 14 wherein the thermally conductive material is a thermally conductive grease.

* * * * *